United States Patent
Wu et al.

(10) Patent No.: US 6,281,069 B1
(45) Date of Patent: Aug. 28, 2001

(54) METHOD FOR FORMING DEEP TRENCH CAPACITOR UNDER A SHALLOW TRENCH ISOLATION STRUCTURE

(75) Inventors: Der-Yuan Wu; Chiu-Te Lee, both of Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/689,395

(22) Filed: Oct. 12, 2000

(30) Foreign Application Priority Data

Sep. 29, 2000 (TW) ................................. 89120198

(51) Int. Cl.[7] ............................................. H01L 21/8242
(52) U.S. Cl. ............................ 438/248; 438/249; 438/256
(58) Field of Search .................................... 438/244, 245, 438/248, 249, 256, 387, 388, 391, 392, 399

(56) References Cited

U.S. PATENT DOCUMENTS

| 6,001,684 | * | 12/1999 | Shen .................................... 438/249 |
| 6,037,210 | * | 3/2000 | Leas ..................................... 438/249 |
| 6,100,130 | * | 8/2000 | Iba et al. ............................. 438/248 |
| 6,140,175 | * | 10/2000 | Kleinhenz et al. .................. 438/248 |

FOREIGN PATENT DOCUMENTS 5-136368- * 6/1993 (JP).

* cited by examiner

*Primary Examiner*—Chandra Chaudhari
(74) *Attorney, Agent, or Firm*—Thomas, Kayden, Horstemeyer & Risley, LLP

(57) ABSTRACT

A method is for forming a deep trench capacitor under a shallow trench isolation structure. The method first provides a substrate and sequentially forms a pad oxide, a first mask layer, and a second mask layer over the substrate. A photoresist layer formed on the second mask layer has a thicker portion and a thinner portion, location of the thinner portion is the predetermined location to be formed an STI structure thereunder. A photoresist opening is between the thicker portion and the thinner portion to form a deep trench in the substrate by etching. The photoresist layer is removed, wherein the second mask layer under the thinner portion of the photoresist layer is also removed to expose the first mask layer. A deep trench capacitor is formed on the lower portion of the deep trench. A dielectric collar layer is formed on the sidewall of the deep trench. A selective growth polysilicon layer is formed to fill the deep trench with a height higher than the substrate surface. A self-aligned STI opening is formed to expose a portion of the dielectric collar layer having a contact with the deep trench. Then, a STI structure is formed to fill the STI opening.

12 Claims, 5 Drawing Sheets

METHOD FOR FORMING DEEP TRENCH CAPACITOR UNDER A SHALLOW TRENCH ISOLATION STRUCTURE

CROSS-REFERENCE TO RELATED APPLICATION

This application claims the priority benefit of Taiwan application serial no. 89120198, filed Sep. 29, 2000.

BACKGROUND OF THE INVENTION

1. Field of Invention

The present invention relates to semiconductor fabrication. More particularly, the present invention relates to a method for forming a deep trench capacitor under a shallow trench isolation structure, suitable for use in a dynamic random access memory (DRAM) device.

2. Description of Related Art

As the dimension of semiconductor device is more and more reduced, such as the fabrication generation of 0.15 microns or less, a DRAM device usually would take a deep trench capacitor formed in the semiconductor substrate to provide the memory function. The deep trench capacitor usually is also formed under a shallow trench isolation structure. The deep trench capacitor has already been widely used in the conventional DRAM. However, since the deep trench capacitor is formed under the shallow trench isolation structure, it needs several times of photomask fabrication, so as to performing etching. How to reduce the use of photomask for reducing the complexity in fabrication is a key issue needed to be considered in device design.

FIGS. 1A–1D are cross-sectional views, schematically illustrating a conventional method to fabricate a deep trench capacitor. In FIG. 1A, a substrate 100 is provided. A pad oxide layer 102, a silicon nitride layer 104, and a photoresist layer 106 are sequentially formed on the substrate 100. The photoresist layer 1106 has an opening 102 to expose the silicon nitride layer 104. Using the opening, the silicon nitride layer 104, the pad oxide layer 102 and the substrate 100 are etched, whereby a deep trench 107 is formed in the substrate. The deep trench usually is about 7–8 microns.

In FIG. 1B, a deep trench capacitor is formed at the lower portion of the deep trench 107. The deep trench capacitor includes a buried plate 108 diffused into the substrate 100, a capacitor dielectric 110, and a polysilicon electrode 112. An oxide collar 114 is formed on a sidewall of the deep trench 107 at the portion above the capacitor. A polysilicon layer fills into the deep trench 107 above the capacitor. The polysilicon layer includes a lower portion between the oxide collar 114 and an upper portion 118 which has a contact to the deep trench. An implantation process with sufficient energy is performed is performed to implant ions into the substrate o as to form a buried plate 120. The buried electrode 120 also has an electric contact on the buried plate 108. Moreover, the polysilicon layer 116, 118 are also implanted with dopants.

In FIG. 1C, The dopants of the polysilicon layer 116, 118 can diffuse into the substrate surface to form a diffusion extension region 124 by a thermal process. The diffusion extension region 124 is used for a connection to a source/drain region of metal-oxide semiconductor (MOS) transistor formed later. At this stage, the trench capacitor 108+110+112 is electrically coupled to the subsequently formed device through the polysilicon layer 116, 118 and the diffusion extension region 124. However, the adjacent two trench capacitors are necessary to be isolated, usually, by a shallow trench isolation (STI) structure. Therefore, it is necessary to form an opening 122. Formation of the opening 122 conventionally needs another photolithography and etching process, so as to properly remove portions of the silicon nitride layer 104, the pad oxide layer 102, the substrate 100, and the polysilicon layer 118. This needs an additional fabrication of photomask and the associated photoresist layer.

In FIG. 1D, a shallow trench isolation structure 126 is formed to fill the shallow trench isolation opening 122. Remaining portions of the silicon nitride layer 104 and the pad oxide layer 102 are removed. A MOS transistor is then formed, where the source/drain region 130 is coupled to the diffusion region 124.

In the foregoing conventional method, the STI structure 126 needs the additional photomask, causing more fabrication complexity and higher fabrication cost.

SUMMARY OF THE INVENTION

The invention provides a method for forming a deep trench capacitor under a shallow trench isolation structure. The method uses a photoresist layer with different thickness. Due to the difference of thickness, the mask layer can be patterned also when the photoresist layer is removed. This allows the subsequent etching process can be performed by a self-aligned manner, so as to form a STI opening without a need of extra photomask.

As embodied and broadly described herein, the invention provides a method for forming a deep trench capacitor under a shallow trench isolation structure. The method includes providing a substrate and sequentially forming pad oxide layer, a first mask layer, and a second mask layer over the substrate. Then, a photoresist layer is formed on the second mask layer, where the photoresist layer relatively has a thicker portion and a thinner portion, the thinner portion is located on a predetermined location to be formed an STI structure thereunder. There is a photoresist opening between the thicker portion and the thinner portion in the photoresist layer to expose the second mask layer. An opening is formed under the photoresist opening by etching the second mask layer, the first mask layer, the pad oxide layer, and the substrate. The lower portion of the opening in the substrate is a deep trench. The photoresist layer is removed, wherein the second mask layer under the thinner portion of the photoresist layer is also removed by self-aligned manner.

A deep trench capacitor is formed on the lower portion of the deep trench. A dielectric collar layer is formed above the deep trench capacitor, on the sidewall of the deep trench. A selective growth polysilicon layer is formed to fill the deep trench of the opening and a height of the selective growth polysilicon layer is higher than a substrate surface. A first self-aligned etching process is performed, using the second mask layer as an etching mask, to remove exposed portions of the first mask layer and the pad oxide layer, thereby exposing a portion of the substrate where is to be formed a STI structure therein. A second self-aligned etching process is performed, using the second mask layer as an etching mask, to simultaneously etch the selective growth polysilicon and the exposed portion of the substrate, whereby a self-aligned STI opening is formed. The self-aligned STI opening exposes a portion of the dielectric collar layer having a contact with the deep trench. Then, a STI structure is formed to fill the STI opening.

In the foregoing, due to different thickness of the photoresist layer, the portion of the second mask layer under the thinner portion is also removed to expose the first mask layer. In the subsequent etching process the second mask layer to the first mask layer can be distinguished by the etching selectivity. This allows the self-aligned etching process to be performed. Moreover, since the height of the selective growth polysilicon layer in the opening is higher than the substrate surface, a STI opening with the profile can be self-aligned etched.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

One of the features of the invention is using a photoresist layer with different step height. When the photoresist layer is removed, the mask layer under the photoresist layer can be also patterned. This allows the subsequent etching process to form a shallow trench isolation (STI) opening by a self-aligned manner without using an additional photomask. An embodiment is provided in the following for descriptions.

Figure 1A:
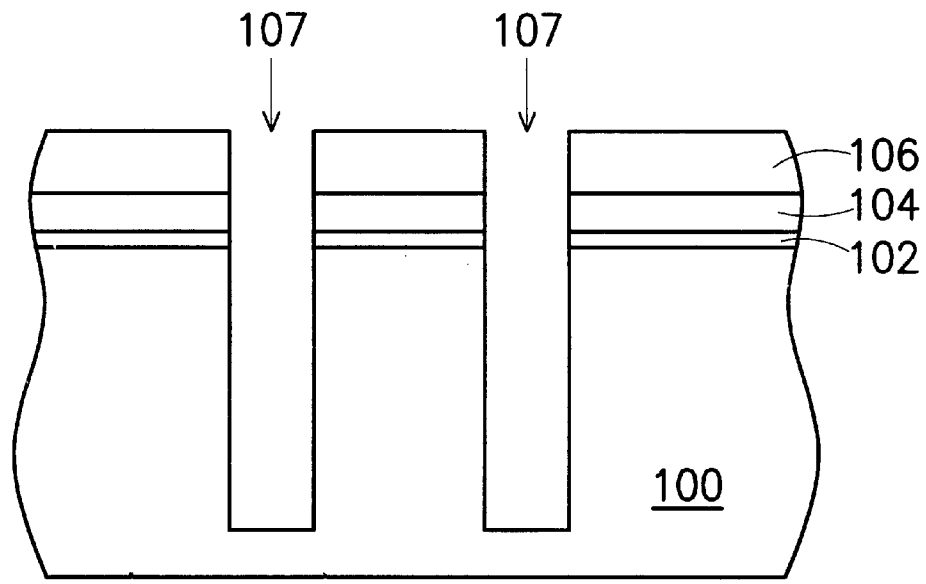
FIGS. 1A–1D are cross-sectional views, schematically illustrating a conventional method to form a trench capacitor under the STI structure.
Figure 1B:
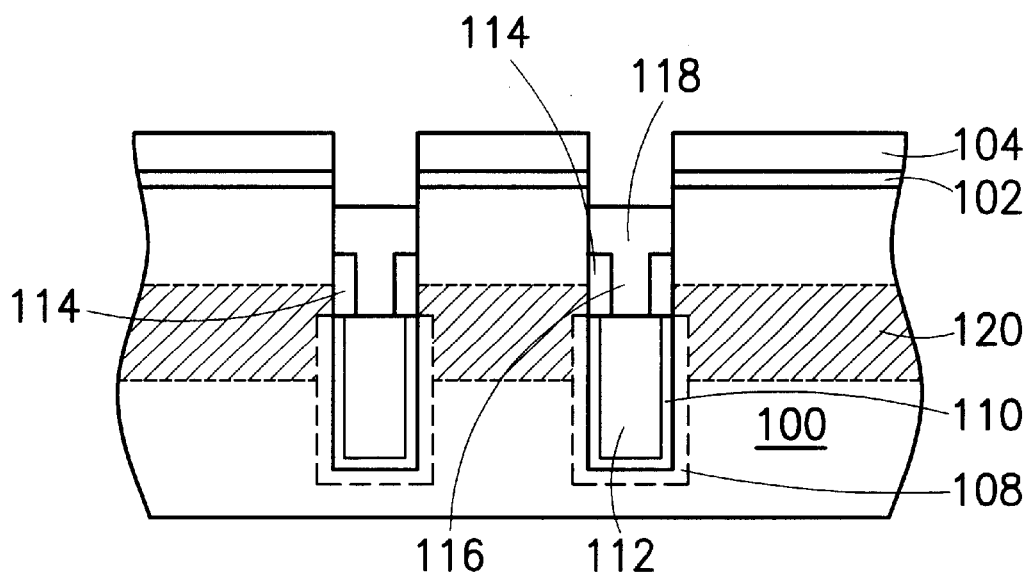
Figure 1C:
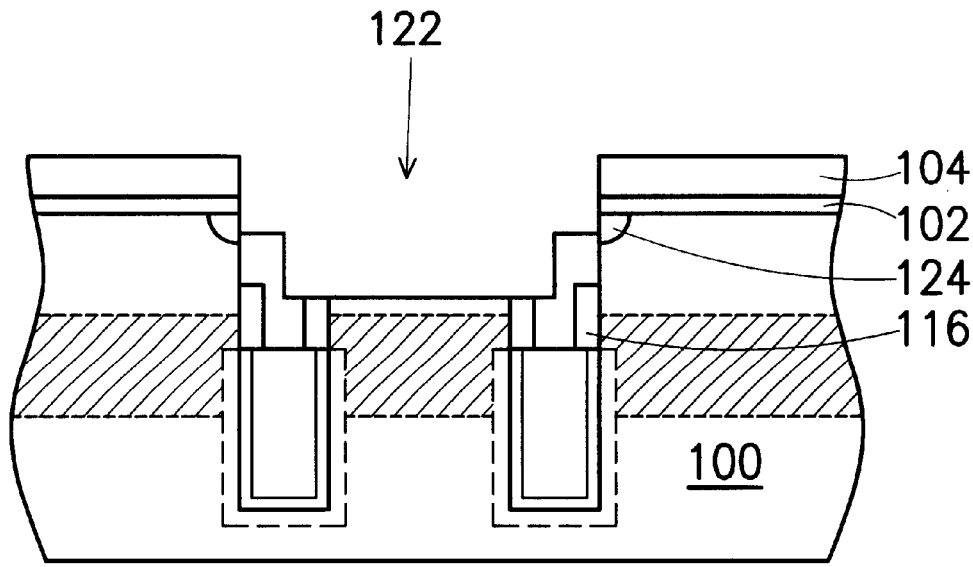
Figure 1D:
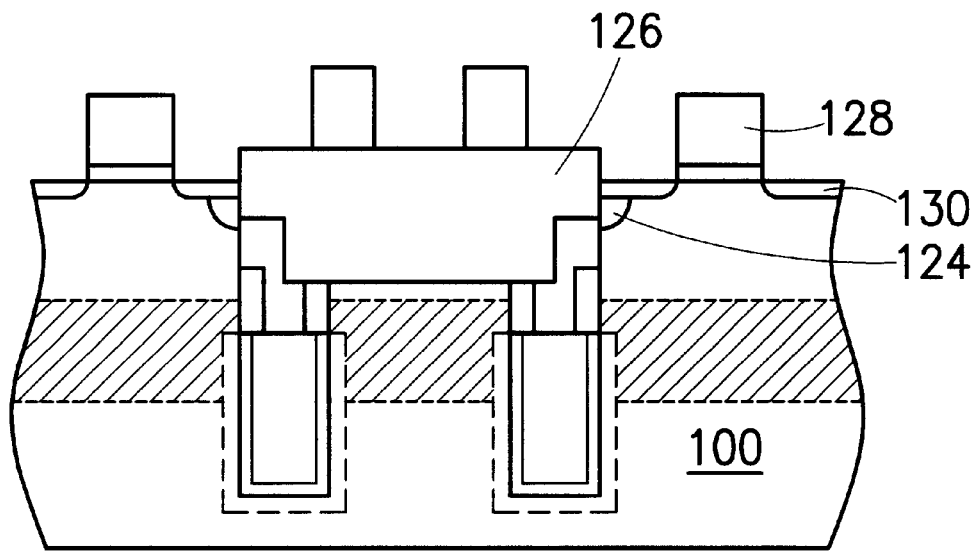
Figure 2A:
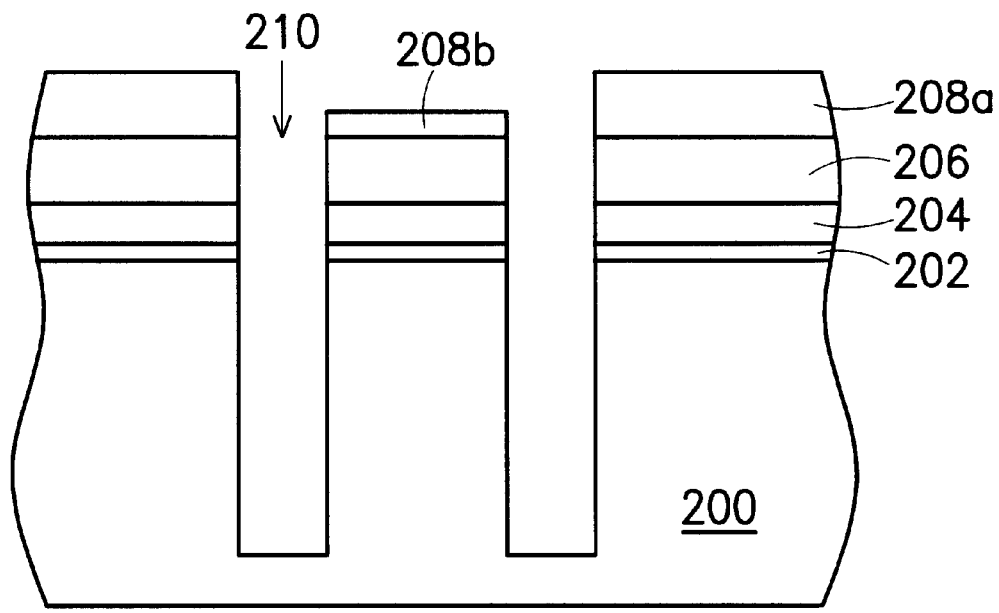
FIGS. 2A–2E are cross-sectional views, schematically illustrating a method to form a trench capacitor under the STI structure, according to one preferred embodiment of this invention.

FIGS. 2A–2E are cross-sectional views, schematically illustrating a method to form a trench capacitor under the STI structure, according to one preferred embodiment of this invention. In FIG. 2A, a substrate 200 is provided. On the substrate 200, many layers are already formed, including a pad oxide layer 202, a hard mask layer, such as a nitride layer 204, another mask layer, such as oxide layer 206, and a photoresist layers 208a, 208b. The part of the photoresist layer 208a has a thickness greater than a thickness of the part of the photoresist layer 208b. An opening is formed between the photoresist layers 208a and 208b to expose the oxide layer 206. The oxide layer 206, the nitride layer 204, the pad oxide layer 202, and the substrate 200 are etched to formed a deep trench 210 in the substrate 200 by using the photoresist layers 208a, 208b with the opening as a mask. The deep trench 210 usually has a depth of about 7–8 microns. Here, the location of the photoresist layer 208b is the place where a self-aligned shallow trench isolation (STI) structure is to be formed. The photoresist layer 208b having a less thickness can produce some results that can be seen in the later descriptions in detail.

In order to form the photo resist layer with different thickness, several conventional photomask methods can be used. For example, phase-shift photomask technology, dyed pellicle photomask technology, and low transparent pellicle photomask technology are three conventional technologies known by the one skilled in the art.

Figure 2B:
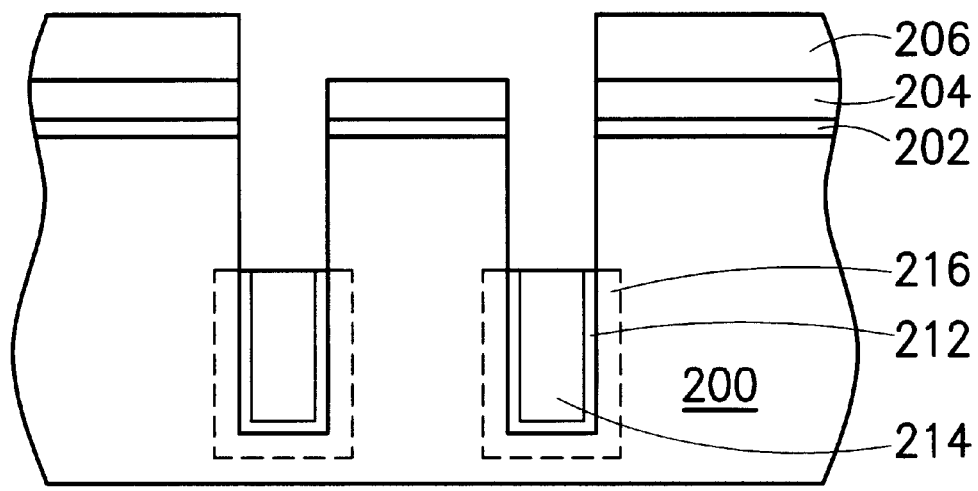

In FIG. 2B, the photoresist layers 208a, 208b are removed. Here, since the photoresist layer 208b is thinner, a portion of the oxide layer 206 under the photoresist layer 208b is also removed to expose the second mask layer when two parts 208a and 208b of the photoresist layer are removed. At this current state, the exposed mask layer structure includes the first mask layer 204 and the second mask layer 206 that have different materials.

Then, a trench capacitor is formed at the lower portion of the deep trench 210. The trench capacitor includes, for example, a buried plate 216, a capacitor dielectric layer 212, and a polysilicon electrode 214. The capacitor dielectric layer 212 includes, for example, an oxide/nitride/oxide (O/N/O) dielectric layer or an oxide/nitride (O/N) dielectric layer. The method for forming the buried plate 216 includes, for example, forming a doped dielectric layer, such as arsenic silicate glass (ASG) or phosphosilicate glass (PSG), on the peripheral surface of the deep trench 210. Forming a photoresist layer filling into the deep trench 210 up to a predetermined depth. The portion of the doped dielectric layer above the photoresist layer is removed by wet etching. A thermal process is performed to diffuse dopants of the doped dielectric layer into the substrate 200 at the lower portion of the deep trench 210. The photoresist layer is removed. Then, a capacitor dielectric layer and a polysilicon layer are deposited over the substrate. An etching back process is performed to removed the top portions of capacitor dielectric layer and the polysilicon layer. Thereby, the capacitor dielectric layer 212 and the polysilicon electrode 214 are formed.

Figure 2C:
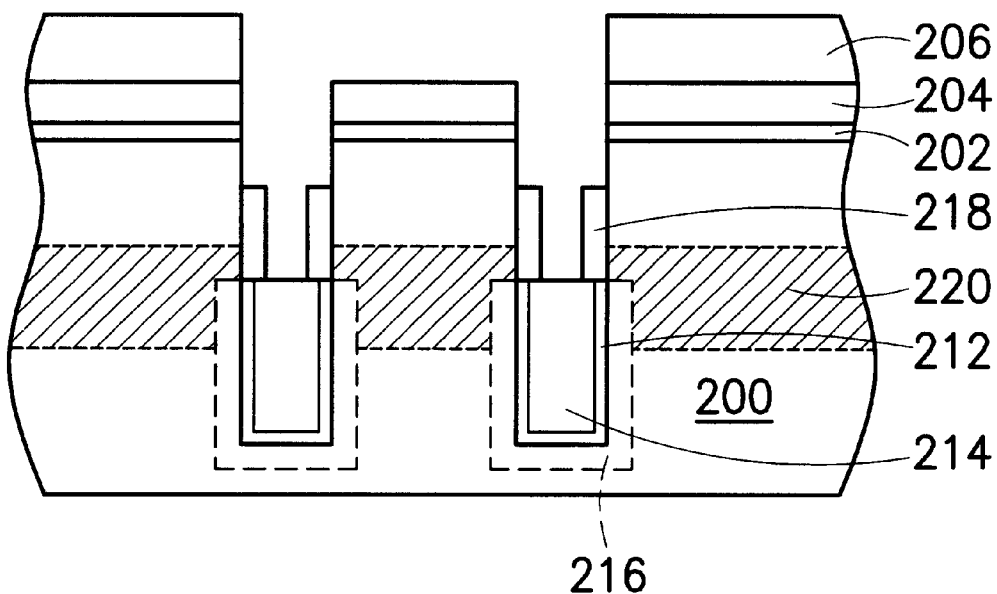

In FIG. 2C, a dielectric collar layer 218 is formed on a sidewall of the deep trench 210 above the trench capacitor, at least covering the exposed end portion of capacitor the dielectric layer 212. The dielectric collar 218 preferably include silicon oxide, and its thickness usually is about 1000 angstroms. The dielectric collar layer 218 does not completely cover the sidewall of deep trench 210. An implantation is performed with sufficient ion energy, so as to implant the ions into the substrate 200 to form a buried plate 220. The buried plate 220 has an electrical contact with the buried plate 216.

Figure 2D:
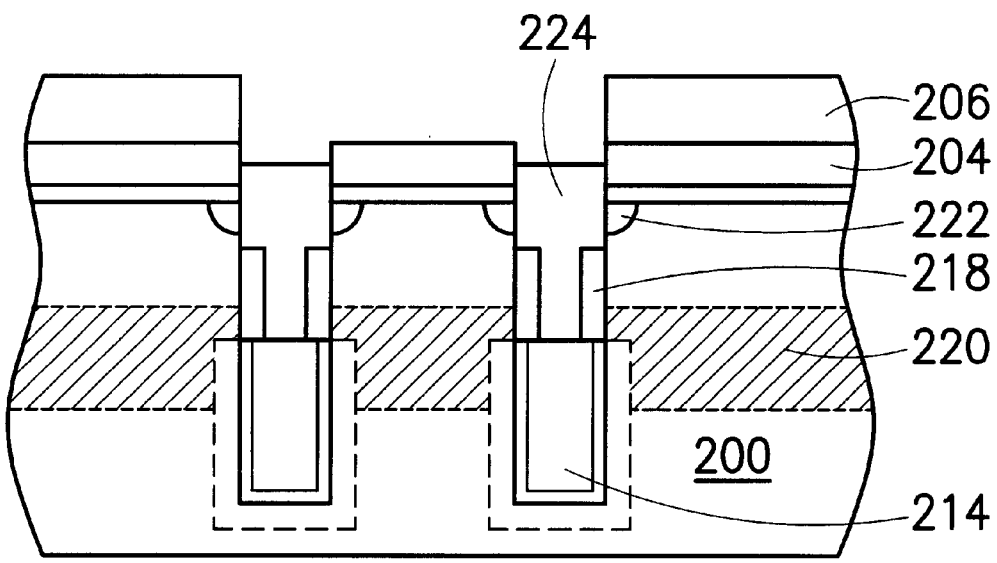

FIG. 2D, a selective growth polysilicon layer 224 is formed to fill into the deep trench 210. The surface height of the selective growth polysilicon layer 224 is higher than the substrate surface 200 but less than the nitride layer 204. The nitride layer 204, such as silicon nitride, has a thickness of, for example, 2000 angstroms. The nitride layer 204 allows the selective growth polysilicon layer 224 to be formed with the surface height greater than the substrate. This also allows the subsequent formation of the STI opening can be performed by a self-aligned manner.

In the foregoing, the selective growth polysilicon layer 224 can be formed by depositing a polysilicon layer over the substrate 200 and filling up the deep trench 210. An etching back process, using the mask layers 204 and 206, is performed to etch the polysilicon layer to a predetermined depth as described above, so that the selective growth polysilicon layer 224 is formed. The selective growth polysilicon layer 224 is also doped with dopants. A thermal process is performed to diffuse the dopants of the selective growth polysilicon layer 224 into the substrate surface, so as to form a diffusion extension region 222.

Figure 2E:
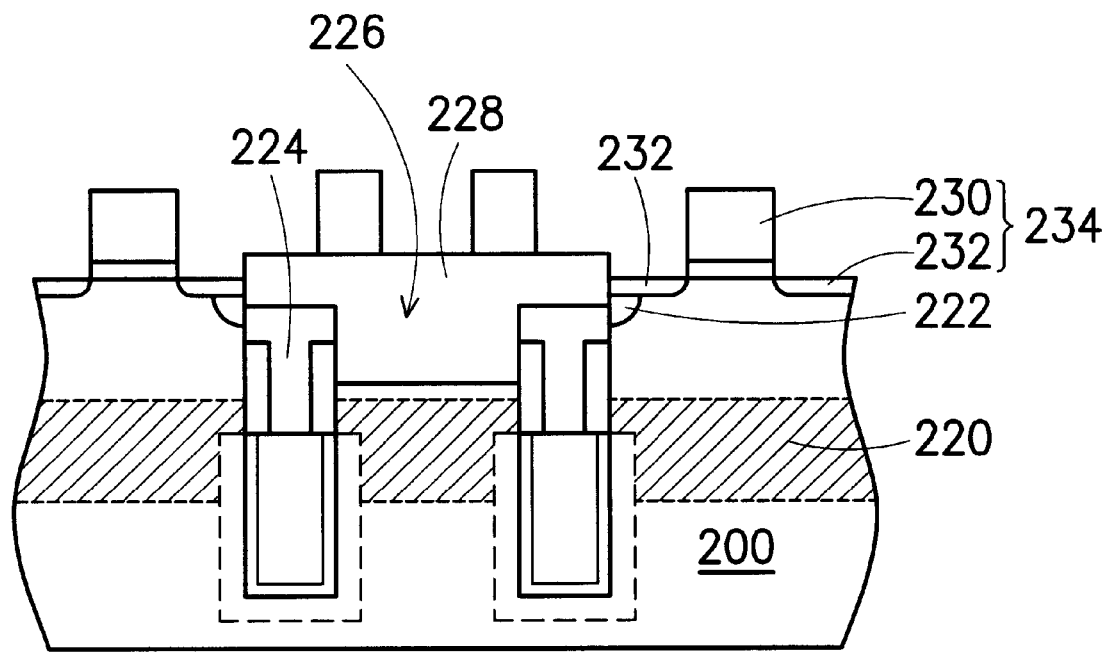

From FIGS. 2D to FIG. 2E, since the nitride layer 204 and the oxide layer 206 are two different materials, a proper etching selectivity can be chosen to remove the exposed portion of the nitride layer 204 using the oxide layer 206 as a mask under the self-aligned manner. The portion of the pad oxide layer 202 under the nitride layer 204 is also removed to expose a portion of the substrate 200. A self-aligned etching process, using the oxide layer 206 as a mask, is performed to simultaneously etch the selective growth polysilicon layer 224 and the exposed portion of the substrate 200, thereby forming a STI opening 226. The depth of the STI opening 226 is at a level at least exposing a portion of the dielectric collar layer 218 at the outer side wall having contact with the deep trench 210. After the STI structure 228 fills into the STI opening 226, The STI structure 228 together with the dielectric collar layer 218 serves isolation function between two adjacent trench capacitors.

In the foregoing, the formation of the STI opening 226 are performed under a self-aligned manner without an extra photolithographic process for forming the etching mask. The STI structure 228 in the invention can particularly be named as a shallow trench isolation (SASTI). For the formation of the STI 228, it includes, for example, depositing an insulating layer over the substrate 200. A chemical mechanical polishing (CMP) process, using the nitride layer 204 as a polishing stop, is performed to polish away the oxide layer 206 and a portion of the insulating layer above the STI opening 226. The nitride layer 204 and the pad oxide layer 202 are subsequently removed to expose the substrate 200.

In FIG. 2E, a metal-oxide semiconductor (MOS) transistor 234 is formed on the substrate 200. The MOS transistor 234 includes a gate structure 230 and a source/drain region 232. One of the source/drain region 232 is electrically coupled to the diffusion extension region 222. Then, the trench capacitor is coupled to the MOS transistor 234.

In the invention as shown in FIG. 2A, due to the photoresist layers 208a, 208b having different thickness, also and the different materials of the mask layers 204 and 206, the subsequent etching processes can be performed under a self-aligned manner. This can effectively simplified the formation of the STI structure. It needs no an extra precise photolithographic process for forming the photoresist etching mask layer.

Moreover, the invention also uses the selective growth polysilicon layer 224, so as to have a height higher than the substrate surface. When the selective growth polysilicon layer 224 is etched, the substrate is also etched by the self-aligned manner, thereby to form the STI opening 226.

The invention needs no an extra photoresist layer, used to pattern the STO opening 226. The fabrication complexity and the fabrication cost are effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a deep trench capacitor under shallow trench isolation (STI) structure, the method comprising:

providing a substrate, wherein the substrate sequentially has a pad oxide layer, a first mask layer, and a second mask layer;

forming a photoresist layer on the second mask layer, wherein the photoresist layer relatively has a thicker portion and a thinner portion, the thinner portion is located on a predetermined location to be formed an STI structure thereunder, and a photoresist opening is formed between the thicker portion and the thinner portion to expose the second mask layer;

etching the second mask layer, the first mask layer, the pad oxide layer, and the substrate to form an opening under the photoresist opening, wherein a lower portion of the opening in the substrate is a deep trench;

removing the photoresist layer, wherein the second mask layer under the thinner portion of the photoresist layer is also removed by a self-aligned manner;

forming a first buried plate diffused in the substrate, surrounding a lower portion of the deep trench;

forming a capacitor dielectric layer and a polysilicon electrode, filling into a lower portion of the deep trench;

forming a dielectric collar layer on a sidewall of the deep trench above the polysilicon electrode, wherein the dielectric collar layer covers an exposed surface of the capacitor dielectric layer within the deep trench but not fully covers the sidewall of the deep trench;

performing implantation to form a second buried plate region inside the substrate with a distance to a substrate surface, whereby the second buried plate region has electrical contact with the first buried plate;

forming a selective growth polysilicon layer, filling into the deep trench of the opening with a height of the selective growth polysilicon layer higher than the substrate surface;

performing a first self-aligned etching process, using the second mask layer as an etching mask, to remove portions of the first mask layer and the pad oxide layer, thereby exposing a portion of the substrate;

performing a second self-aligned etching process, using the second mask layer as an etching mask, simultaneously etching the selective growth polysilicon layer and the exposed portion of the substrate, whereby an STI opening is formed and exposes a portion of the collar dielectric layer at a side originally having contact with the deep trench; and forming the STI structure, filling into the STI opening.

2. The method of claim 1, wherein the first mask layer includes nitride and the second mask layer includes oxide.

3. The method of claim 1, wherein the step of forming the photoresist layer on the second mask layer includes using a phase-shift photomask technology.

4. The method of claim 1, wherein the step of forming the photoresist layer on the second mask layer includes using a dyed pellicle photomask technology.

5. The method of claim 1, wherein the step of forming the photoresist layer on the second mask layer includes using a low transparent pellicle photomask technology.

6. The method of claim 1, wherein the step of forming the selective growth polysilicon layer comprises:

depositing a doped polysilicon layer, filling into the deep trench; and etching back the polysilicon layer down to the a depth.

7. The method of claim 1, wherein the step of forming the dielectric collar comprises forming an oxide collar.

8. The method of claim 1, wherein the step of forming the STI structure, filling into the STI opening comprises:

depositing an insulating layer over the substrate, filling into the STI opening;

performing a chemical mechanical polishing process, using the first mask layer as a polishing stop, to polish away the second mask layer and a portion of the insulating layer; and removing the second mask layer and the pad oxide layer.

9. A method for forming a deep trench capacitor under shallow trench isolation (STI) structure, the method comprising:

providing a substrate, wherein the substrate sequentially has a pad oxide layer, a first mask layer, and a second mask layer;

forming a photoresist layer on the second mask layer, wherein the photoresist layer relatively has a thicker portion and a thinner portion, the thinner portion is located on a predetermined location to be formed an STI structure thereunder, and a photoresist opening is formed between the thicker portion and the thinner portion to expose the second mask layer;

etching the second mask layer, the first mask layer, the pad oxide layer, and the substrate to form an opening under the photoresist opening, wherein a lower portion of the opening in the substrate is a deep trench;

removing the photoresist layer, wherein the second mask layer under the thinner portion of the photoresist layer is also removed by a self-aligned manner;

forming a deep trench capacitor in the deep trench;

forming a dielectric collar layer on a sidewall of the deep trench above the deep trench capacitor dielectric;

forming a selective growth polysilicon layer, filling into the deep trench of the opening with a height of the selective growth polysilicon layer higher than a substrate surface;

performing a first self-aligned etching process, using the second mask layer as an etching mask, to remove portions of the first mask layer and the pad oxide layer, thereby exposing a portion of the substrate;

performing a second self-aligned etching process, using the second mask layer as an etching mask, simultaneously etching the selective growth polysilicon layer and the exposed portion of the substrate, whereby an STI opening is formed and exposes a portion of the collar dielectric layer at a side originally having contact with the deep trench; and forming the STI structure, filling into the STI opening.

10. The method of claim 9, wherein the step of forming selective growth polysilicon layer comprises:

depositing a polysilicon layer, filling into the deep trench; and etching back the polysilicon layer to a depth.

11. The method of claim 9, wherein the step of forming the dielectric collar comprises forming an oxide collar.

12. The method of claim 9, wherein the step of forming the STI structure, filling into the STI opening comprises:

depositing an insulating layer over the substrate, filling into the STI opening;

performing a chemical mechanical polishing process, using the first mask layer as a polishing stop, to polish away the second mask layer and a portion of the insulating layer; and removing the second mask layer and the pad oxide layer.

* * * * *